(12) United States Patent
Carney et al.

(10) Patent No.: US 9,481,809 B2
(45) Date of Patent: *Nov. 1, 2016

(54) MULTILAYER FILM

(71) Applicant: E I DU PONT DE NEMOURS AND COMPANY, Wilmington, DE (US)

(72) Inventors: Thomas Edward Carney, Orient, OH (US); Jeffrey Michael Bartolin, Westerville, OH (US); Christopher Robert Becks, Grove City, OH (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/565,826

(22) Filed: Dec. 10, 2014

(65) Prior Publication Data
US 2015/0166832 A1 Jun. 18, 2015

Related U.S. Application Data

(60) Provisional application No. 61/915,690, filed on Dec. 13, 2013.

(51) Int. Cl.
*B05D 7/00* (2006.01)
*C09D 179/08* (2006.01)
*B32B 7/00* (2006.01)
(Continued)

(52) U.S. Cl.
CPC ............... *C09D 179/08* (2013.01); *B05D 7/52* (2013.01); *B32B 7/00* (2013.01); *B32B 7/02* (2013.01); *B32B 7/12* (2013.01); *B32B 19/00* (2013.01); *B32B 27/00* (2013.01); *B32B 27/06* (2013.01); *B32B 27/08* (2013.01); *B32B 27/14* (2013.01); *B32B 27/18* (2013.01); *B32B 27/20* (2013.01); *B32B 27/28* (2013.01); *B32B 27/281* (2013.01); *B32B 27/38* (2013.01); *C08G 73/1042* (2013.01); *C08G 73/1071* (2013.01); *C08K 3/04* (2013.01); *C08K 3/36* (2013.01); *H05K 3/281* (2013.01); *H05K 2201/0195* (2013.01); *Y10T 428/24967* (2015.01)

(58) Field of Classification Search
None
See application file for complete search history.

(56) References Cited

U.S. PATENT DOCUMENTS 7,018,704 B2 3/2006 Kaneshiro et al.
8,124,223 B2 2/2012 Kanakarajan et al.
(Continued)

FOREIGN PATENT DOCUMENTS

EP 0659553 A1 * 6/1995
EP 0659553 A1 6/1995
(Continued)

OTHER PUBLICATIONS

Research Disclosure RD405061A, dated Jan. 10, 1998.
(Continued)

*Primary Examiner* — Tahseen N Khan

(57) ABSTRACT

The present disclosure is directed to multilayer film having has an L* color less than 30 and a 60 degree gloss value less than 10. The multilayer film has a first polyimide layer and a second polyimide layer. The second polyimide layer has 45 to 67 wt % of a polyimide, greater than 14 wt % of a silica matting agent or a mixture of silica matting agent and at least one additional matting agent, and at least one submicron carbon black, wherein the total amount of the submicron carbon black and the polyimide is less than 85 wt % and greater than 45 wt %.

20 Claims, 1 Drawing Sheet

(51) Int. Cl.
*B32B 7/02* (2006.01)
*B32B 7/12* (2006.01)
*B32B 19/00* (2006.01)
*B32B 27/00* (2006.01)
*B32B 27/06* (2006.01)
*B32B 27/08* (2006.01)
*B32B 27/14* (2006.01)
*B32B 27/18* (2006.01)
*B32B 27/20* (2006.01)
*B32B 27/28* (2006.01)
*B32B 27/38* (2006.01)
*C08G 73/10* (2006.01)
*C08K 3/04* (2006.01)
*C08K 3/36* (2006.01)
*H05K 3/28* (2006.01)

(56) References Cited

U.S. PATENT DOCUMENTS

| | | | |
|---|---|---|---|
| 2007/0009751 A1 | 1/2007 | Hwang et al. | |
| 2007/0166535 A1 | 7/2007 | Lu et al. | |
| 2011/0039085 A1* | 2/2011 | Carney | C08J 5/18 428/220 |
| 2012/0141758 A1* | 6/2012 | Boussaad | C08J 5/18 428/220 |
| 2012/0141759 A1* | 6/2012 | Boussaad | C08L 79/08 428/220 |
| 2012/0142825 A1* | 6/2012 | Boussaad | C08L 79/08 524/39 |
| 2012/0142826 A1* | 6/2012 | Boussaad | C08J 5/18 524/40 |
| 2013/0011645 A1 | 1/2013 | Carney et al. | |
| 2013/0029166 A1* | 1/2013 | Carney | C08J 5/18 428/473.5 |
| 2013/0065033 A1 | 3/2013 | Wu et al. | |
| 2014/0220335 A1 | 8/2014 | Lin et al. | |
| 2015/0166832 A1* | 6/2015 | Carney | B32B 7/00 428/215 |
| 2015/0166833 A1* | 6/2015 | Carney | B32B 27/281 428/215 |

FOREIGN PATENT DOCUMENTS

| | | |
|---|---|---|
| WO | 2010/101822 A1 | 9/2010 |
| WO | 2011/017291 A1 | 2/2011 |
| WO | WO2012011970 A * | 1/2012 |

OTHER PUBLICATIONS

International Search Report and Written Opinion Dated Mar. 2, 2015 for International Application No. PCT/US2014/069503.

* cited by examiner

MULTILAYER FILM

FIELD OF DISCLOSURE

This disclosure relates generally to a multilayer film. More specifically, the multilayer film has a first polyimide layer and a second polyimide layer containing a matting agent and submicron carbon black.

BACKGROUND OF THE DISCLOSURE

Industry increasingly desires polyimide films for electronic application to be matte in appearance, have a specific color, durability to handling and circuit processing, and when used as a coverlay, provide security against unwanted visual inspection of the electronic components protected by the coverlay. Single layer matte luster films do not have an L* color less than 30 providing deep, rich saturated colors desired by industry. Typically, as the amount of matting agent is increased the color of the film becomes muted. The effect of increased surface roughness from the matting agent is the dilution of the pigment color so that it appears lighter and less saturated. This is caused by the dilution of the diffuse reflectance (where pigment color is perceived) by the increased scatter of the specular reflectance (white light). The rougher the surface, the lower the gloss and greater the scatter of the specular reflectance. Thus, as gloss decreases, L* (lightness) typically increases. Adding more colorant does not decrease the L* color. Thus, simultaneously achieving low gloss and low L* color is therefore difficult.

For the forgoing reasons, a need exists for a polyimide film that is matte in appearance, has deep, rich saturated colors, as well as provide sufficient optical density to provide visual security when used as a coverlay while having acceptable electrical properties (e.g., dielectric strength) mechanical properties, and durability to handling and circuit processing.

SUMMARY

The present disclosure is directed to a multilayer film comprising:
  a. a first polyimide layer from 8 to 130 microns thick comprising: a polyimide derived from at least 50 mole percent of an aromatic dianhydride, based upon a total dianhydride content of the polyimide, and at least 50 mole percent of an aromatic diamine based upon a total diamine content of the polyimide;
  b. a second polyimide layer from 0.5 to 25 microns thick in direct contact with the first polyimide layer, the second polyimide layer comprising:
    i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
    ii) greater than 14 wt % of a silica matting agent or a mixture of silica matting agent and at least one additional matting agent; and
    iii) at least one submicron carbon black, wherein the total amount of the submicron carbon black and the polyimide is less than 85 wt % and greater than 45 wt %; and
wherein the multilayer film has an L* color less than 30 and a 60 degree gloss value less than 10.

DETAILED DESCRIPTION

Definitions

Figure 1:
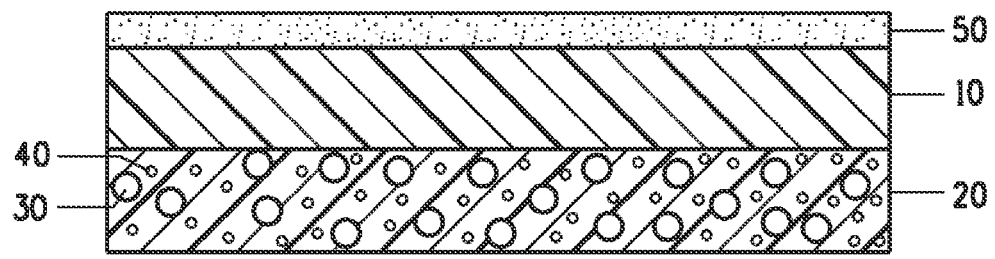
FIG. 1 illustrates an adhesive layer in direct contact with the first polyimide layer opposite from the second polyimide layer according to one embodiment of the present disclosure.

Also, use of the "a" or "an" are employed to describe elements and components of the invention. This is done merely for convenience and to give a general sense of the invention. This description should be read to include one or at least one and the singular also includes the plural unless it is obvious that it is meant otherwise.

The term "polyamic acid" as used herein is intended to include any polyimide precursor material derived from a combination of dianhydride and diamine and capable of conversion to a polyimide.

The term "Film" as used herein is intended to mean a free-standing film or a (self-supporting or non self-supporting) coating. The term "film" is used interchangeably with the term "layer" and refers to covering a desired area.

The present disclosure is directed to multilayer films that achieve a desired L* color of less than 30 and a 60 degree gloss of less than 10 while maintaining acceptable electrical properties, mechanical properties, and durability to handling and circuit processing. The multilayer film comprises a first polyimide layer and a second polyimide layer.

First Polyimide Layer

The first polyimide layer is derived from at least 50 mole percent of an aromatic dianhydride, based upon a total dianhydride content of the polyimide, and at least 50 mole percent of an aromatic diamine based upon a total diamine content of the polyimide. The term "dianhydride" as used herein is intended to include precursors, derivatives or analogs thereof, which may not technically be a dianhydride but would nevertheless react with a diamine to form a polyamic acid which could in turn be converted into a polyimide. The term "diamine" as used herein is intended to include precursors, derivatives or analogs thereof, which may not technically be a diamine but would nevertheless react with a dianhydride to form a polyamic acid which could in turn be converted into a polyimide.

In one embodiment, the aromatic dianhydride is selected from the group consisting of:
pyromellitic dianhydride;
3,3',4,4'-biphenyl tetracarboxylic dianhydride;
3,3',4,4'-benzophenone tetracarboxylic dianhydride;
4,4'-oxydiphthalic anhydride;
3,3',4,4'-diphenyl sulfone tetracarboxylic dianhydride;
2,2-bis(3,4-dicarboxyphenyl) hexafluoropropane;
Bisphenol A dianhydride; and
  mixtures and derivatives thereof.
In another embodiment, the aromatic dianhydride is selected from the group consisting of:
2,3,6,7-naphthalene tetracarboxylic dianhydride;
1,2,5,6-naphthalene tetracarboxylic dianhydride;
2,2',3,3'-biphenyl tetracarboxylic dianhydride;
2,2-bis(3,4-dicarboxyphenyl) propane dianhydride;
bis(3,4-dicarboxyphenyl) sulfone dianhydride;
3,4,9,10-perylene tetracarboxylic dianhydride;

1,1-bis(2,3-dicarboxyphenyl) ethane dianhydride;
1,1-bis(3,4-dicarboxyphenyl) ethane dianhydride;
bis(2,3-dicarboxyphenyl) methane dianhydride;
bis(3,4-dicarboxyphenyl) methane dianhydride;
oxydiphthalic dianhydride;
bis(3,4-dicarboxyphenyl) sulfone dianhydride;
mixtures and derivatives thereof.

In some embodiments, examples of suitable aliphatic dianhydrides include but are not limited to: cyclobutane dianhydride; [1S*,5R*,6*]-3-oxabicyclo[3.2.1]octane-2,4-dione-6-spiro-3-(tetrahydrofuran-2,5-dione); and mixtures thereof.

In some embodiments, the aromatic diamine is selected from the group consisting of: 3,4'-oxydianiline; 1,3-bis-(4-aminophenoxy)benzene; 4,4'-oxydianiline; 1,4-diaminobenzene; 1,3-diaminobenzene; 2,2'-bis(trifluoromethyl)benzidene; 4,4'-diaminobiphenyl; 4,4'-diaminodiphenyl sulfide; 9,9'-bis(4-amino)fluorine; mixtures and derivatives thereof.

In another embodiment, the aromatic diamine is selected from a group consisting of: 4,4'-diaminodiphenyl propane; 4,4'-diamino diphenyl methane; benzidine; 3,3'-dichlorobenzidine; 3,3'-diamino diphenyl sulfone; 4,4'-diamino diphenyl sulfone; 1,5-diamino naphthalene; 4,4'-diamino diphenyl diethylsilane; 4,4'-diamino diphenysilane; 4,4'-diamino diphenyl ethyl phosphine oxide; 4,4'-diamino diphenyl N-methyl amine; 4,4'-diamino diphenyl N-phenyl amine; 1,4-diaminobenzene (p-phenylene diamine); 1,2-diaminobenzene; mixtures and derivatives thereof.

In some embodiments, examples of suitable aliphatic diamines include: hexamethylene diamine, dodecane diamine, cyclohexane diamine and mixtures thereof.

In one embodiment, the first polyimide layer comprises a polyimide derived from pyromellitic dianhydride and 4,4'-oxydianiline.

In some embodiments, the first polyimide layer is between and including any two of the following thicknesses: 8, 10, 20, 30, 40, 50, 60, 70, 80, 90, 100, 110, 120 and 130 microns thick. In another embodiment, the first polyimide layer is from 8 to 130 microns thick. In another embodiment, the first polyimide layer is from 10 to 30 microns thick. In another embodiment, the first polyimide layer is from 12 to 25 microns thick.

The first polyimide layer may optionally contain 1 to 15 wt % low conductivity carbon black. In some embodiments the first polyimide layer contains between and including any two of the following: 1, 5, 10 and 15 wt % low conductivity carbon black. In yet another embodiment, the first polyimide layer contains 2 to 9 wt % low conductivity carbon black.

Low conductivity carbon black is intended to mean, channel type black, furnace black or lamp black. In some embodiments, the low conductivity carbon black is a surface oxidized carbon black. One method for assessing the extent of surface oxidation (of the carbon black) is to measure the carbon black's volatile content. The volatile content can be measured by calculating weight loss when calcined at 950° C. for 7 minutes. Generally speaking, a highly surface oxidized carbon black (high volatile content) can be readily dispersed into a polyamic acid solution (polyimide precursor), which in turn can be imidized into a (well dispersed) filled polyimide base polymer of the present disclosure. It is thought that if the carbon black particles (aggregates) are not in contact with each other, then electron tunneling, electron hopping or other electron flow mechanism are generally suppressed, resulting in lower electrical conductivity. In some embodiments, the low conductivity carbon black has a volatile content greater than or equal to 1%. In some embodiments, the low conductivity carbon black has a volatile content greater than or equal to 5, 9, or 13%. In some embodiments, furnace black may be surface treated to increase the volatile content. Typically, a low conductivity carbon black has a pH less than 6.

A uniform dispersion of isolated, carbon black particles (aggregates) not only decreases the electrical conductivity, but additionally tends to produce uniform color intensity. In some embodiments the low conductivity carbon black is milled. In some embodiments, the mean particle size of the low conductivity carbon black is between (and optionally including) any two of the following sizes: 0.2, 0.3, 0.4, 0.5, 0.6, 0.7, 0.8, 0.9 and 1.0 microns.

The first polyimide layer may optionally contain 1 to 40 wt % pigment or dye. In some embodiments the first polyimide layer contains 1 to 40 wt % of a mixture of pigments and dyes. In some embodiments, the first polyimide layer contains between and including any two of the following: 1, 5, 10, 15, 20, 25, 30, 35 and 40 wt % pigment, dye or mixtures thereof. In some embodiments, the first polyimide layer contains 1 to 40 wt % of a mixture of at least two of the following: low conductivity carbon black, pigments or dyes.

Virtually any pigment (or combination of pigments) can be used in the performance of the present invention. In some embodiments, useful pigments include but are not limited to the following: Barium Lemon Yellow, Cadmium Yellow Lemon, Cadmium Yellow Lemon, Cadmium Yellow Light, Cadmium Yellow Middle, Cadmium Yellow Orange, Scarlet Lake, Cadmium Red, Cadmium Vermilion, Alizarin Crimson, Permanent Magenta, Van Dyke brown, Raw Umber Greenish, or Burnt Umber. In some embodiments, useful black pigments include: cobalt oxide, Fe—Mn—Bi black, Fe—Mn oxide spinel black, (Fe,Mn)2O3 black, copper chromite black spinel, lampblack, bone black, bone ash, bone char, hematite, black iron oxide, micaceous iron oxide, black complex inorganic color pigments (CICP), (Ni,Mn, Co)(Cr,Fe)2O4 black, Aniline black, Perylene black, Anthraquinone black, Chromium Green-Black Hematite, Chrome Iron Oxide, Pigment Green 17, Pigment Black 26, Pigment Black 27, Pigment Black 28, Pigment Brown 29, Pigment Brown 35, Pigment Black 30, Pigment Black 32, Pigment Black 33 or mixtures thereof.

In some embodiments, the pigment is lithopone, zinc sulfide, barium sulfate, cobalt oxide, yellow iron oxide, orange iron oxide, red iron oxide, brown iron oxide, hematite, black iron oxide, micaceous iron oxide, chromium (III) green, ultramarine blue, ultramarine violet, ultramarine pink, cyanide iron blue, cadmium pigments or lead chromate pigments.

In some embodiments, the pigment is complex inorganic color pigments (CICP) such as spinel pigments, rutile pigments, zircon pigments or bismuth vanadate yellow. In some embodiments, useful spinel pigments include but are not limited to: Zn(Fe,Cr)2O4 brown, CoAl2O4 blue, Co(AlCr)2O4 blue-green, Co2TiO4 green, CuCr2O4 black or (Ni, Mn,Co)(Cr,Fe)2O4 black. In some embodiments, useful rutile pigments include but are not limited to: Ti—Ni—Sb yellow, Ti—Mn—Sb brown, Ti—Cr—Sb buff, zircon pigments or bismuth vanadate yellow.

In another embodiment, the pigment is an organic pigment.

In some embodiments, useful organic pigments include but are not limited to: Aniline black (Pigment Black 1), Anthraquinone black, Monoazo type, Diazo type, Benzimidazolones, Diarylide yellow, Monoazo yellow salts, Dinitaniline orange, Pyrazolone orange, Azo red, Naphthol red, Azo condensation pigments, Lake pigments, Copper Phthalocyanine blue, Copper Phthalocyanine green, Quinacridones, Diaryl Pyrrolopyrroles, Aminoanthraquinone pigments, Dioxazines, Isoindolinones, Isoindolines, Quinophthalones, phthalocyanine pigments, idanthrone pigments, pigment violet 1, pigment violet 3, pigment violet 19 or pigment violet 23. In yet another embodiment, the organic pigment is a Vat dye pigment, such as but not limited to: perylene, perylene black, perinones or thioindigo. A uniform dispersion of isolated, individual pigment particles (aggregates) tends to produce uniform color intensity. In some embodiments the pigment is milled. In some embodiments, the mean particle size of the pigment is between (and optionally including) any two of the following sizes: 0.2, 0.3, 0.4, 0.5, 0.6, 0.7, 0.8, 0.9 and 1.0 microns. In some embodiments, luminescent (fluorescent or phosphorescent), or pearlescent pigments can be used, alone, or in combination with other pigments or dyes.

In some embodiments, the first polyimide layer further comprises 1 to 20 wt % of a matting agent selected from silica, alumina, zirconia, boron nitride, barium sulfate, polyimide particles, calcium phosphate, talc or mixtures thereof. In another embodiment, the first polyimide layer further comprises 1 to 20 wt % of a matting agent that is a carbon black having a mean particle size from 2 to 9 micrometers. In yet another embodiment, the first polyimide layer further comprises 1 to 20 wt % of a matting agent, the matting agent being a mixture of i) carbon black having a mean particle size from 2 to 9 microns; and ii) silica, alumina, zirconia, boron nitride, barium sulfate, polyimide particles, calcium phosphate, talc or mixtures thereof.

In some embodiments, the first polyimide layer comprises:

i) a chemically converted polyimide in an amount from 71 to 96 wt %, the chemically converted polyimide being derived from:

a. at least 50 mole percent of an aromatic dianhydride, based upon a total dianhydride content of the polyimide, and b. at least 50 mole percent of an aromatic diamine, based upon a total diamine content of the polyimide;

ii) a low conductivity carbon black present in an amount from 2 to 9 weight percent of the base film; and iii) a matting agent that:

a. is present in an amount from 1.6 to 10 weight percent of the base film, b. has a median particle size from 1.3 to 10 microns, and c. has a density from 2 to 4.5 g/cc.

In a chemical conversion process, the polyamic acid solution is either immersed in or mixed with conversion (imidization) chemicals. In one embodiment, the conversion chemicals are tertiary amine catalysts (accelerators) and anhydride dehydrating materials. In one embodiment, the anhydride dehydrating material is acetic anhydride, which is often used in molar excess relative to the amount of amic acid (amide acid) groups in the polyamic acid, typically about 1.2 to 2.4 moles per equivalent of polyamic acid. In one embodiment, a comparable amount of tertiary amine catalyst is used.

Alternatives to acetic anhydride as the anhydride dehydrating material include: i. other aliphatic anhydrides, such as, propionic, butyric, valeric, and mixtures thereof; ii. anhydrides of aromatic monocarboxylic acids; iii. Mixtures of aliphatic and aromatic anhydrides; iv. carbodimides; and v. aliphatic ketenes (ketenes may be regarded as anhydrides of carboxylic acids derived from drastic dehydration of the acids).

In one embodiment, the tertiary amine catalysts are pyridine and beta-picoline and are typically used in amounts similar to the moles of anhydride dehydrating material. Lower or higher amounts may be used depending on the desired conversion rate and the catalyst used. Tertiary amines having approximately the same activity as the pyridine, and beta-picoline may also be used. These include alpha picoline; 3,4-lutidine; 3,5-lutidine; 4-methyl pyridine; 4-isopropyl pyridine; N,N-dimethylbenzyl amine; isoquinoline; 4-benzyl pyridine, N,N-dimethyldodecyl amine, triethyl amine, and the like. A variety of other catalysts for imidization are known in the art, such as imidazoles, and may be useful in accordance with the present disclosure.

The conversion chemicals can generally react at about room temperature or above to convert polyamic acid to polyimide. In one embodiment, the chemical conversion reaction occurs at temperatures from 15° C. to 120° C. with the reaction being very rapid at the higher temperatures and relatively slower at the lower temperatures.

In one embodiment, the chemically treated polyamic acid solution can be cast or extruded onto a heated conversion surface or substrate. In one embodiment, the chemically treated polyamic acid solution can be cast on to a belt or drum. The solvent can be evaporated from the solution, and the polyamic acid can be partially chemically converted to polyimide. The resulting solution then takes the form of a polyamic acid-polyimide gel. Alternately, the polyamic acid solution can be extruded into a bath of conversion chemicals consisting of an anhydride component (dehydrating agent), a tertiary amine component (catalyst) or both with or without a diluting solvent. In either case, a gel film is formed and the percent conversion of amic acid groups to imide groups in the gel film depends on contact time and temperature but is usually about 10 to 75 percent complete. For curing to a solids level greater than 98%, the gel film typically must be dried at elevated temperature (from about 200° C., up to about 550° C.), which will tend to drive the imidization to completion. In some embodiments, the use of both a dehydrating agent and a catalyst is preferred for facilitating the formation of a gel film and achieve desired conversion rates.

Second Polyimide Layer

The second polyimide layer comprises 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide. In some embodiments, the second polyimide layer comprises between and including any two of the following: 45, 50, 55, 60, 65 and 67 wt % of a polyimide. In another embodiment, the second polyimide layer comprises 45 to 60 wt % of a polyimide.

In one embodiment, the aromatic dianhydride is selected from the group consisting of:
pyromellitic dianhydride;
3,3',4,4'-biphenyl tetracarboxylic dianhydride;
3,3',4,4'-benzophenone tetracarboxylic dianhydride;
4,4'-oxydiphthalic anhydride;
3,3',4,4'-diphenyl sulfone tetracarboxylic dianhydride;
2,2-bis(3,4-dicarboxyphenyl) hexafluoropropane;
Bisphenol A dianhydride; and
mixtures and derivatives thereof.

In another embodiment, the aromatic dianhydride is selected from the group consisting of:
2,3,6,7-naphthalene tetracarboxylic dianhydride;
1,2,5,6-naphthalene tetracarboxylic dianhydride;
2,2',3,3'-biphenyl tetracarboxylic dianhydride;
2,2-bis(3,4-dicarboxyphenyl) propane dianhydride;
bis(3,4-dicarboxyphenyl) sulfone dianhydride;
3,4,9,10-perylene tetracarboxylic dianhydride;
1,1-bis(2,3-dicarboxyphenyl) ethane dianhydride;
1,1-bis(3,4-dicarboxyphenyl) ethane dianhydride;
bis(2,3-dicarboxyphenyl) methane dianhydride;
bis(3,4-dicarboxyphenyl) methane dianhydride;
oxydiphthalic dianhydride;
bis(3,4-dicarboxyphenyl) sulfone dianhydride;
mixtures and derivatives thereof.

In some embodiments, examples of suitable aliphatic dianhydrides include but are not limited to: cyclobutane dianhydride; [1S*,5R*,6S*]-3-oxabicyclo[3.2.1]octane-2,4-dione-6-spiro-3-(tetrahydrofuran-2,5-dione); and mixtures thereof.

In some embodiments, the aromatic diamine is selected from the group consisting of: 3,4'-oxydianiline; 1,3-bis-(4-aminophenoxy)benzene; 4,4'-oxydianiline; 1,4-diaminobenzene; 1,3-diaminobenzene; 2,2'-bis(trifluoromethyl)benzidene; 4,4'-diaminobiphenyl; 4,4'-diaminodiphenyl sulfide; 9,9'-bis(4-amino)fluorine; mixtures and derivatives thereof.

In another embodiment, the aromatic diamine is selected from a group consisting of: 4,4'-diaminodiphenyl propane; 4,4'-diamino diphenyl methane; benzidine; 3,3'-dichlorobenzidine; 3,3'-diamino diphenyl sulfone; 4,4'-diamino diphenyl sulfone; 1,5-diamino naphthalene; 4,4'-diamino diphenyl diethylsilane; 4,4'-diamino diphenysilane; 4,4'-diamino diphenyl ethyl phosphine oxide; 4,4'-diamino diphenyl N-methyl amine; 4,4'-diamino diphenyl N-phenyl amine; 1,4-diaminobenzene (p-phenylene diamine); 1,2-diaminobenzene; mixtures and derivatives thereof.

In some embodiments, examples of suitable aliphatic diamines include: hexamethylene diamine, dodecane diamine, cyclohexane diamine and mixtures thereof.

In one embodiment, the second polyimide layer comprises a polyimide derived from pyromellitic dianhydride and 4,4'-oxydianiline or derived from pyromellitic dianhydride, 4,4'-oxydianiline and paraphenylenediamine. In another embodiment, the second polyimide layer comprises a polyimide derived from i) blocks of pyromellitic dianhydride and 4,4'-oxydianiline and ii) blocks of pyromellitic dianhydride and paraphenylenediamine. In yet another embodiment, the first polyimide layer comprises a polyimide derived from pyromellitic dianhydride and 4,4'-oxydianiline, and the second polyimide layer comprises a polyimide derived from i) pyromellitic dianhydride and 4,4'-oxydianiline, or derived from
ii) pyromellitic dianhydride, 4,4'-oxydianiline and paraphenylenediamine, or derived from
iii) blocks of pyromellitic dianhydride and 4,4'-oxydianiline and blocks of pyromellitic dianhydride and paraphenylenediamine.

The second polyimide layer comprises 45 to 67 wt % of a polyimide. In some embodiments, the second polyimide layer comprises between and including any two of the following: 45, 50, 55, 60, 65 and 67 wt % of a polyimide. In another embodiment, the second polyimide layer comprises 45 to 60 wt % of a polyimide.

In some embodiments, the second polyimide layer is from 0.5 to 25 microns thick. In some embodiments, the second polyimide layer is between and including any two of the following thicknesses: 0.5, 1, 5, 10, 15, 20 and 25 microns thick. In yet another embodiment, the second layer is from 1 to 20 microns thick. In some embodiments, the second layer is from 1 to 12 microns thick. In some embodiments, the second layer is from 1 to 11 microns thick. (in line with examples)

The second layer is in direct contact with the first polyimide layer. The term "direct contact" is intended to mean two surfaces adjacent to each other without an intervening material or adhesive layer between the two surfaces.

The second polyimide layer comprises greater than 14 wt % of a silica matting agent or mixture of matting agents. In some embodiments, the silica matting agent is mixed with one or more additional matting agents selected from alumina, zirconia, boron nitride, barium sulfate, polyimide particles, calcium phosphate, talc or mixtures thereof. The second polyimide layer comprises at least one submicron carbon black, wherein the total amount of the submicron carbon black and the polyimide is less than 85 wt % and greater than 45 wt %. The term "submicron" is intended to mean less than one micron in all dimensions.

The particle size of the submicron carbon black, matting agent or low conductivity carbon black can be measured in the slurries by laser diffraction using either a Horiba LA-930 (Horiba, Instruments, Inc., Irvine Calif.) or a Malvern Mastersizer 3000 (Malvern Instruments, Inc., Westborough, Mass.)

Multilayer Film

The multilayer film in accordance with the present disclosure has an L* color less than 30 and a 60 degree gloss value less than 10 as well as durability to handling and circuit processing. The L* color is measured using a HunterLab ColorQuest® XE color meter (Hunter Associates Laboratory, Inc.) in the reflectance, specular included mode and reported in the CIELAB 10°/D65 system, as L*, a*, b*. A L* value of 0 is pure black, while a L* value of 100 is pure white. The 60 degree gloss was measured using a Micro-TRI-gloss glossmeter (from BYK-Gardner).

FIG. 1 illustrates one embodiment of the present disclosure, a multilayer film comprising an adhesive layer 50 in direct contact with the first polyimide layer 10 opposite the second polyimide layer 20 wherein the second polyimide layer comprises a silica matting agent 30 and a submicron carbon black 40. In some embodiments, the adhesive layer is an epoxy adhesive selected from the group consisting of: Bisphenol A type epoxy resin, cresol novolac type epoxy resin, phosphorus containing epoxy resin, and mixtures thereof. Typically, an adhesive layer is as thick or thicker than the first polyimide layer or the second polyimide layer. In some embodiments the adhesive layer is from 8 to 300 microns thick.

In some embodiments, the adhesive is a mixture of two or more epoxy resins. In some embodiments, the adhesive is a mixture of the same epoxy resin having different molecular weights.

In some embodiments, the epoxy adhesive contains a hardener. In some embodiments, the epoxy adhesive contains a catalyst. In some embodiments, the epoxy adhesive contains an elastomer toughening agent. In some embodiments, the epoxy adhesive contains a flame retardant.

In some embodiments, the multilayer film further comprises a third polyimide layer. In some embodiments, the third polyimide layer is from 0.5 to 25 microns thick. In another embodiment, the third polyimide layer is between and including any two of the following thicknesses: 0.5, 1, 5, 10, 15, 20 and 25 micron thick. In some embodiments, the third polyimide layer is from 0.5 to 15 microns thick. In some embodiments, the third polyimide layer is from 0.5 to 8 microns thick. In some embodiments, the multilayer film further comprises a third polyimide layer from 0.5 to 25 microns thick in direct contact with the first polyimide layer opposite the second polyimide layer.

A third polyimide layer, is particularly desired when the multilayer film is coextruded. The third polyimide layer, when similar to or the same as the second polyimide layer, helps prevent curl. The third polyimide layer may be the same as, or different from, the second polyimide layer.

In some embodiments, the third polyimide layer comprises:
i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
ii) greater than 14 wt % of a matting agent or mixture of matting agents; and
iii) at least one submicron carbon black, wherein the total amount of the submicron carbon black and the polyimide is less than 85 wt % and greater than 45 wt %.

In one embodiment, the third polyimide layer comprises a polyimide derived from pyromellitic dianhydride and 4,4'-oxydianiline. In another embodiment, the third polyimide layer comprises a polyimide derived from pyromellitic dianhydride, 4,4'-oxydianiline and paraphenylenediamine. In another embodiment, the third polyimide layer comprises a polyimide derived from i) blocks of pyromellitic dianhydride and 4,4'-oxydianiline and ii) blocks of pyromellitic dianhydride and paraphenylenediamine. In one embodiment, the matting agent in the third polyimide layer is selected from silica, alumina, zirconia, boron nitride, barium sulfate, polyimide particles, calcium phosphate, talc or mixtures thereof. In another embodiment, the matting agent in the third polyimide layer is a carbon black having a mean particle size from 2 to 9 microns. In yet another embodiment, the matting agent in the third polyimide layer is a mixture of
i) carbon black having a mean particle size from 2 to 9 microns; and
ii) silica, alumina, zirconia, boron nitride, barium sulfate, polyimide particles, calcium phosphate, talc or mixtures thereof.

Figure 2:
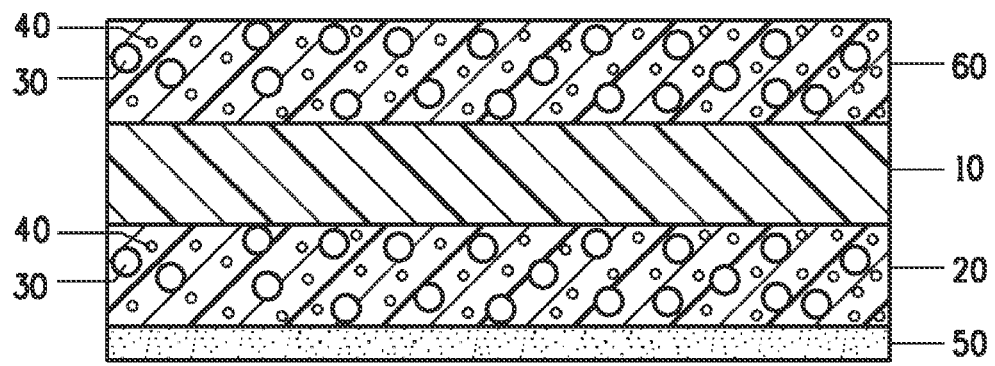
FIG. 2 illustrates a third polyimide layer, an adhesive layer in direct contact with the second polyimide layer on a surface of the second polyimide layer furthest from the first polyimide layer.

FIG. 2 illustrates another embodiment of the present disclosure, a multilayer film comprising a third polyimide layer 60, an adhesive layer 50 in direct contact with the second polyimide layer 20 on a surface of the second polyimide layer furthest from the first polyimide layer 10, wherein the second polyimide layer comprises a silica matting agent 30 and a submicron carbon black 40. In yet another embodiment, an adhesive layer may be in direct contact with the third polyimide layer on a surface of the third polyimide furthest from the first polyimide layer.

In one embodiment, the multilayer film comprises:
a. a first polyimide layer from 8 to 130 microns thick comprising: a polyimide derived from at least 50 mole percent of an aromatic dianhydride, based upon a total dianhydride content of the polyimide, and at least 50 mole percent of an aromatic diamine based upon a total diamine content of the polyimide;
b. a second polyimide layer from 0.5 to 25 microns thick in direct contact with the first polyimide layer, the second polyimide layer comprising:
i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide;
ii) greater than 14 wt % of: a silica matting agent or a mixture of silica matting agent and at least one additional matting agent; and
iii) at least one submicron carbon black, wherein the total amount of the submicron carbon black and the polyimide is less than 85 wt % and greater than 45 wt %; and
wherein the multilayer film has an L* color less than 30 and a 60 degree gloss value less than 10.

In one embodiment, the multilayer film comprises:
a. a first polyimide layer from 8 to 130 microns thick comprising: a polyimide derived from pyromellitic dianhydride and 4,4'-oxydianiline;
b. a second polyimide layer from 0.5 to 25 microns thick in direct contact with the first polyimide layer, the second polyimide layer comprising:
i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide;
ii) greater than 14 wt % of: a silica matting agent or a mixture of silica matting agent and at least one additional matting agent; and
iii) at least one submicron carbon black, wherein the total amount of the submicron carbon black and the polyimide is less than 85 wt % and greater than 45 wt %; and
wherein the multilayer film has an L* color less than 30 and a 60 degree gloss value less than 10.

In one embodiment, the multilayer film comprises:
a. a first polyimide layer from 8 to 130 microns thick comprising: a polyimide derived from pyromellitic dianhydride and 4,4'-oxydianiline;
b. a second polyimide layer from 0.5 to 25 microns thick in direct contact with the first polyimide layer, the second polyimide layer comprising:
i) 45 to 67 wt % of a polyimide derived from pyromellitic dianhydride and 4,4'-oxydianiline or derived from pyromellitic dianhydride, 4,4'-oxydianiline and paraphenylenediamine;
ii) greater than 14 wt % of: a silica matting agent or a mixture of silica matting agent and at least one additional matting agent; and
iii) at least one submicron carbon black, wherein the total amount of the submicron carbon black and the polyimide is less than 85 wt % and greater than 45 wt %; and
wherein the multilayer film has an L* color less than 30 and a 60 degree gloss value less than 10.

In one embodiment, the multilayer film comprises:
a. a first polyimide layer from 8 to 130 microns thick comprising: a polyimide derived from at least 50 mole percent of an aromatic dianhydride, based upon a total dianhydride content of the polyimide, and at least 50 mole percent of an aromatic diamine based upon a total diamine content of the polyimide;
b. a second polyimide layer from 0.5 to 25 microns thick in direct contact with the first polyimide layer, the second polyimide layer comprising:
i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide ii) greater than 14 wt % of: a silica matting agent or a mixture of silica matting agent and at least one additional matting agent; and
iii) at least one submicron carbon black, wherein the total amount of the submicron carbon black and the polyimide is less than 85 wt % and greater than 45 wt %; and c. an adhesive layer in direct contact with the first polyimide layer opposite the second polyimide layer; wherein the adhesive layer is an epoxy resin selected from the group consisting of: Bisphenol A type epoxy resin, cresol novolac type epoxy resin, phosphorus containing epoxy resin, and mixtures thereof wherein the multilayer film has an L* color less than 30 and a 60 degree gloss value less than 10.

In one embodiment, the multilayer film comprises:
a. a first polyimide layer from 8 to 130 microns thick comprising: a polyimide derived from at least 50 mole percent of an aromatic dianhydride, based upon a total dianhydride content of the polyimide, and at least 50 mole percent of an aromatic diamine based upon a total diamine content of the polyimide;
b. a second polyimide layer from 0.5 to 25 microns thick in direct contact with the first polyimide layer, the second polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of: a silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
c. a third polyimide layer from 0.5 to 25 microns thick in direct contact with the first polyimide layer opposite the second polyimide layer, the third polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of a silica matting agent; and
   iii) at least one submicron carbon black, wherein the total amount of the submicron carbon black and the polyimide is less than 85 wt % and greater than 45 wt %.

In one embodiment, the multilayer film comprises:
a. a first polyimide layer from 8 to 130 microns thick comprising: a polyimide derived from pyromellitic dianhydride and 4,4'-oxydianiline;
b. a second polyimide layer from 0.5 to 25 microns thick in direct contact with the first polyimide layer, the second polyimide layer comprising:
   i) 45 to 67 wt % of a polyimide derived from pyromellitic dianhydride and 4,4'-oxydianiline or derived from pyromellitic dianhydride, 4,4'-oxydianiline and paraphenylenediamine;
   ii) greater than 14 wt % of a silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
c. a third polyimide layer from 0.5 to 25 microns thick in direct contact with the first polyimide layer opposite the second polyimide layer, the third polyimide layer comprising:
   i) 45 to 67 wt % of a polyimide derived from pyromellitic dianhydride and 4,4'-oxydianiline or derived from pyromellitic dianhydride, 4,4'-oxydianiline and paraphenylenediamine;
   ii) greater than 14 wt % of a silica matting agent or a mixture of silica matting agent and at least one additional matting agent; and
   iii) at least one submicron carbon black, wherein the total amount of the submicron carbon black and the polyimide is less than 85 wt % and greater than 45 wt %.

In one embodiment, the multilayer film comprises:
a. a first polyimide layer from 8 to 130 microns thick comprising: a polyimide derived from at least 50 mole percent of an aromatic dianhydride, based upon a total dianhydride content of the polyimide, and at least 50 mole percent of an aromatic diamine based upon a total diamine content of the polyimide;
b. a second polyimide layer from 0.5 to 25 microns thick in direct contact with the first polyimide layer, the second polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of: silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
c. a third polyimide layer from 0.5 to 25 microns thick in direct contact with the first polyimide layer opposite the second polyimide layer, the third polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of a silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
d. an adhesive layer in direct contact with the second polyimide layer or the third polyimide layer on a surface of the second polyimide layer or third polyimide layer opposite from the first polyimide layer; wherein the adhesive layer is an epoxy resin selected from the group consisting of: Bisphenol A type epoxy resin, cresol novolac type epoxy resin, phosphorus containing epoxy resin, and mixtures thereof; and wherein the multilayer film has an L* color less than 30 and a 60 degree gloss value less than 10.

In one embodiment, the multilayer film comprises:
a. a first polyimide layer from 8 to 130 microns thick comprising:
   i) a polyimide derived from at least 50 mole percent of an aromatic dianhydride, based upon a total dianhydride content of the polyimide, and at least 50 mole percent of an aromatic diamine based upon a total diamine content of the polyimide;
   ii) 1 to 15 wt % low conductivity carbon black, or 1 to 40 wt % pigment or dye;
b. a second polyimide layer from 0.5 to 25 microns thick in direct contact with the first polyimide layer, the second polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of: a silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
wherein the multilayer film has an L* color less than 30 and a 60 degree gloss value less than 10.

In one embodiment, the multilayer film comprises:
a. a first polyimide layer from 8 to 130 microns thick comprising:
   i) a polyimide derived from at least 50 mole percent of an aromatic dianhydride, based upon a total dianhydride content of the polyimide, and at least 50 mole percent of an aromatic diamine based upon a total diamine content of the polyimide;
   ii) 1 to 15 wt % low conductivity carbon black, or 1 to 40 wt % pigment or dye;
   iii) 1 to 20 wt % of a matting agent selected from silica, alumina, zirconia, boron nitride, barium sulfate, polyimide particles, calcium phosphate, talc or mixtures thereof;
b. a second polyimide layer from 0.5 to 25 microns thick in direct contact with the first polyimide layer, the second polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of a silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
wherein the multilayer film has an L* color less than 30 and a 60 degree gloss value less than 10.

In one embodiment, the multilayer film comprises:
a. a first polyimide layer comprising:
   i) a chemically converted polyimide in an amount from 71 to 96 weight percent, the chemically converted polyimide being derived from at least 50 mole percent of an aromatic dianhydride, based upon a total dianhydride content of the polyimide, and at least 50 mole percent of an aromatic diamine based upon a total diamine content of the polyimide;
   ii) a low conductivity carbon black present in an amount from 2 to 9 weight percent of the base film; and
   iii) a matting agent that:
       a. is present in an amount from 1.6 to 10 weight percent of the base film,
       b. has a median particle size from 1.3 to 10 microns, and
       c. has a density from 2 to 4.5 Wm.
b. a second polyimide layer from 0.5 to 25 microns thick in direct contact with the first polyimide layer, the second polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of a silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
wherein the multilayer film has an L* color less than 30 and a 60 degree gloss value less than 10.

In one embodiment, the multilayer film comprises:
a. a first polyimide layer comprising:
   i) a chemically converted polyimide in an amount from 71 to 96 weight percent, the chemically converted polyimide being derived from: at least 50 mole percent of an aromatic dianhydride, based upon a total dianhydride content of the polyimide, and at least 50 mole percent of an aromatic diamine based upon a total diamine content of the polyimide;
   ii) a low conductivity carbon black present in an amount from 2 to 9 weight percent of the base film; and
   iii) a matting agent that:
       a. is present in an amount from 1.6 to 10 weight percent of the base film,
       b. has a median particle size from 1.3 to 10 microns, and
       c. has a density from 2 to 4.5 Wm.
b. a second polyimide layer from 0.5 to 25 microns thick in direct contact with the first polyimide layer, the second polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of: a silica matting agent or a mixture of silica matting agent and at least one additional matting agent; and
   iii) at least one submicron carbon black, wherein the total amount of the submicron carbon black and the polyimide is less than 85 wt % and greater than 45 wt %; and
c. a third polyimide layer from 0.5 to 25 microns thick in direct contact with the first polyimide layer opposite the second polyimide layer, the third polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
ii) greater than 14 wt % of a matting agent or mixture of matting agents; and
iii) at least one submicron carbon black, wherein the total amount of the submicron carbon black and the polyimide is less than 85 wt % and greater than 45 wt %;
and wherein the multilayer film has an L* color less than 30 and a 60 degree gloss value less than 10.

Another embodiment of the present disclosure is a method of producing a multilayer film having an L* color less than 30 and a 60 degree gloss value less than 10; the method comprising:
a. providing a first polyimide layer from 8 to 130 microns thick;
b. coating a second polyimide layer from 0.5 to 8 microns thick on to the first polyimide layer; the second polyimide layer comprising:
i) at least 40 wt % of a polyimide derived from at least 50 mole percent of an aromatic dianhydride, based upon a total dianhydride content of the polyimide, and at least 50 mole percent of an aromatic diamine based upon a total diamine content of the polyimide;
ii) at least 20 wt % of: a silica matting agent or a mixture of silica matting agent and at least one additional matting agent;
iii) at least one carbon black wherein the total amount of carbon black and matting agent is at least 40 wt % or greater.

The first polyimide layer and the second polyimide layer of the present disclosure can be made by any well-known method in the art for making filled polyimide films. In some embodiments, the first polyimide layer and the second polyimide layer are made by a thermal conversion process (thermally imidized) in which the polyamic acid solution is heated to temperatures typically greater than 250° C. to convert the polyamic acid to a polyimide. In another embodiment, the first polyimide layer and the second polyimide layer are made by a chemical conversion process (chemically imidized). In one embodiment, one such method includes preparing a pigment slurry. The slurry may or may not be milled using a ball mill or continuous media mill to reach the desired particle size. The slurry may or may not be filtered to remove any residual large particles. A polyamic acid prepolymer solution is prepared by reacting dianhydride with a slight excess of diamine. The polyamic acid solution is mixed in a high shear mixer with the pigment slurry. The amount of the polyamic acid solution, pigment slurry, and finishing solution can be adjusted to achieve the desired loading levels of pigment and the desired viscosity for film formation. "Finishing solution" herein denotes a dianhydride in a polar aprotic solvent which is added to a prepolymer solution to increase the molecular weight and viscosity. The dianhydride used is typically the same dianhydride used (or one of the same dianhydrides when more than one is used) to make the prepolymer. The mixture can be metered through a slot die and cast or manually cast onto a smooth stainless steel belt or substrate to produce a gel film. Conversion chemicals can be metered in before casting using a slot die. For conversion to greater than 98 percent solids level, the gel film typically must be dried at elevated temperature (convective heating from 200-300° C. and radiant heating from 400-800° C.), which will tend to drive the imidization to completion. In yet another embodiment, the first polyimide layer and the second polyimide layer are independently made by either a thermal conversion process or a chemical conversion process.

The multilayer film of the present disclosure can be prepared by any well-known method such as but not limited to coextrusion, lamination (laminating single layers together), coating and combinations thereof. A description of a coextrusion process for preparing multilayer polyimide films is provided in EP 0659553 A1 to Sutton et al. Coating methods include, but are not limited to, spray coating, curtain coating, knife over roll, air knife, extrusion/slot die, gravure, reverse gravure, offset gravure, roll coating, and dip/immersion.

In some embodiments, the multilayer film is prepared by simultaneously extruding (coextruding) the first polyimide layer and the second polyimide layer. In some embodiments, the multilayer film is prepared by simultaneously extruding (coextruding) the first polyimide layer, the second polyimide layer and the third polyimide layer. In some embodiments, the layers are extruded through a single or multi-cavity extrusion die. In another embodiment, the multilayer film is produced using a single-cavity die. If a single-cavity die is used, the laminar flow of the streams should be of high enough viscosity to prevent commingling of the streams and to provide even layering. In some embodiments, the multilayer film is prepared by casting from the slot die onto a moving stainless steel belt. In one embodiment, the belt is then passed through a convective oven, to evaporate solvent and partially imidize the polymer, to produce a "green" film. The green film can be stripped off the casting belt and wound up. The green film can then be passed through a tenter oven to produce a fully cured polyimide film. In some embodiments, during tentering, shrinkage can be minimized by constraining the film along the edges (i.e. using clips or pins).

In some embodiments, the multilayer film is made by coating a solution of filler slurries and polyamic acid on the first polyimide layer. The coating is heated to dry. The resulting multilayer film is placed on a pin frame to hold it flat. The coating can be cured in a batch or continuous oven capable of heating to at least 250° C. The oven temperature is ramped to 320° C. over a period of 45 to 60 minutes, then transferred to a 400° C. oven and held for 5 minutes. In some embodiments, chemical imidization catalysts and/or dehydrating agents can be added to the coating solution.

When an amount, concentration, or other value or parameter is given as either a range, preferred range or a list of upper preferable values and lower preferable values, this is to be understood as specifically disclosing all ranges formed from any pair of any upper range limit or preferred value and any lower range limit or preferred value, regardless of whether ranges are separately disclosed. Where a range of numerical values is recited herein, unless otherwise stated, the range is intended to include the endpoints thereof, and all integers and fractions within the range. Numerical values are to be understood to have the precision of the number of significant figures provided. For example, the number 1 shall be understood to encompass a range from 0.5 to 1.4, whereas the number 1.0 shall be understood to encompass a range from 0.95 to 1.04, including the end points of the stated ranges. It is not intended that the scope of the invention be limited to the specific values recited when defining a range.

In describing certain polymers it should be understood that sometimes applicants are referring to the polymers by the monomers used to make them or the amounts of the monomers used to make them. While such a description may not include the specific nomenclature used to describe the final polymer or may not contain product-by-process terminology, any such reference to monomers and amounts should be interpreted to mean that the polymer is made from those monomers, unless the context indicates or implies otherwise.

The materials, methods, and examples herein are illustrative only and, except as specifically stated, are not intended to be limiting. Although methods and materials similar or equivalent to those described herein can be used, suitable methods and materials are described herein.

All publications, patent applications, patents, and other references mentioned herein are incorporated by reference in their entirety. Unless otherwise defined, all technical and scientific terms used herein have the same meaning as commonly understood by one of ordinary skill in the art to which this invention belongs. In case of conflict, the present specification, including definitions, will control.

EXAMPLES

Illustrative preparations and evaluations of films are described below.

Silica Slurry #1 (Syloid® C807):

A silica slurry was prepared, consisting of 75.4 wt % DMAC, 9.6 wt % PMDA/4,4'ODA polyamic acid prepolymer solution (20.6 wt % polyamic acid solids in DMAC) and 15.0 wt % silica powder (Syloid® C 807, from W. R. Grace Co.). The ingredients were thoroughly mixed in a high shear rotor-stator type mixer. Median particle size was 7 microns.

Silica Slurry #2 (Syloid® C803):

A silica slurry was prepared as in Silica slurry #1, except using Syloid® C 803 powder instead of Syloid® C807. Median particle size was 3 microns.

Silica slurry #3 (Sipernat® 500LS):

A silica slurry was prepared as in Silica slurry #1, except using Sipernat® 500LS powder, from Evonik, instead of Syloid® C807. Median particle size was 6 microns.

Silica Slurry #4 (Acematt® HK400):

A silica slurry was prepared as in Silica slurry #1, except using Acematt® HK400 powder, from Evonik, instead of Syloid® C807. Median particle size was 6 microns.

Polyimide Particle Slurry:

A polyimide particle slurry was prepared from a solution of PMDA/4,4'ODA polyamic acid in pyridine and heating the solution to precipitate the polymer. The pyridine solvent was displaced with deionized water and then comminuted in a high shear environment. The deionized water was displaced with DMAc to a 3.6 wt. % solids concentration. Median particle size was 4.0 microns.

Alumina Slurry

An alumina slurry was prepared, consisting of 41.7 wt % DMAC, 23.3 wt % PMDA/4,4'ODA polyamic acid prepolymer solution (20.6 wt % polyamic acid solids in DMAC), and 35.0 wt % alpha alumina powder with median particle size of approximately 2.3 microns. The ingredients were thoroughly mixed in a high shear rotor-stator type mixer.

Carbon Black Slurry #1 (SB4 Carbon):

A carbon black slurry was prepared, consisting of 80 wt. % DMAC, low. % PMDA/4,4'ODA polyamic acid prepolymer solution (20.6 wt. % polyamic acid solids in DMAC), and 10 wt. % carbon black powder (Special Black 4, from Orion Engineered Carbons LLC). The ingredients were thoroughly mixed in a high speed disc-type disperser. The slurry was then processed in a bead mill to disperse any agglomerates and to achieve the desired particle size. Median particle size was 0.3 microns.

Carbon Black Slurry #2 (SB6 Carbon):

A carbon black slurry was prepared, consisting of 82 wt. % DMAC, 12 wt. % carbon black powder (Special Black 6, from Orion Engineered Carbons LLC), and 6 wt. % dispersing agent (Byk 9077, from Byk Chemie). The ingredients were thoroughly mixed in a high speed disc-type disperser. The slurry was then processed in a bead mill to disperse any agglomerates and to achieve the desired particle size. Median particle size was 0.14 microns.

Carbon Black Slurry #3 (FW200 Carbon):

A carbon black slurry was prepared, consisting of 79 wt. % DMAC, 12 wt. % carbon black powder (Color Black FW200, from Orion Engineered Carbons LLC), and 9 wt. % dispersing agent (Byk 9077, from Byk Chemie). The ingredients were thoroughly mixed in a high speed disc-type disperser. The slurry was then processed in a bead mill to disperse any agglomerates and to achieve the desired particle size. Median particle size was 0.15 microns.

Fumed Alumina Slurry

A fumed alumina slurry was prepared, consisting of 76.3 wt. % DMAC, 19.8 wt. % fumed alumina powder (Alu C805, from Evonik), and 3.9 wt. % dispersing agent (Disperbyk 180, from Byk Chemie). The ingredients were thoroughly mixed in a high speed disc-type disperser. The slurry was then processed in a bead mill to disperse any agglomerates and to achieve the desired particle size. Median particle size was 0.3 microns.

Kapton® HN is a standard amber-colored polyimide film based on PMDA/4,4'ODA, manufactured by DuPont.

Kapton® MBC is an opaque matte black polyimide film manufactured by DuPont. It is based on PMDA/4,4'ODA polyimide, and contains approximately 5 wt. % low conductivity carbon black and approximately 2 wt. % of a silica matting agent. It is available in various thicknesses.

PMDA/4,4'ODA polyamic acid solution in DMAC was prepared by conventional means, with excess diamine, to a viscosity of 50-100 Poise. PMDA/4,4'ODA polymer was 20.6% polyamic acid solids.

PMDA/4,4'ODA/PPD Co-Polyamic Acid Solution:

PPD was dissolved in DMAC at 40-45° C. to a concentration of approximately 2.27 wt. %. After reducing the temperature to 30-40° C., solid PMDA was added, with agitation, to achieve a PMDA:PPD stoichiometric ratio of approximately 0.99:1. The mixture was allowed to react for 90 minutes, with agitation. The mixture was diluted to approximately 5.8-6.5% solids by addition of DMAC. 4,4'ODA was then added, to achieve a 4,4'ODA:PPD mole ratio of 70:30, and allowed to react for approximately 30 minutes at 40-45° C. Solid PMDA was incrementally added, with agitation, and allowed to react for approximately 2 hours at 40-45° C., to achieve a polymer viscosity of 75-250 Poise. Polyamic acid solids was 19.5%-20.5%. The polymer solution was stored in a refrigerator until use.

Preparation of Multilayer Film Examples 1-18 and Comparative Examples C1-C25

The First polyimide layer comprised Kapton® MBC or Kapton® HN film, as indicated in Table 1.

Second polyimide layer was prepared using the filler slurries as described above and as indicated in Table 1. The slurries were thoroughly mixed with polyamic acid solution, described above and indicated in Table 1, in the appropriate ratio to produce the desired composition after curing. In examples 1, 2, 4, 16, 18, C11, C14 and C16 a small amount (~0.05%) of a wetting aid (Coatosil L77) was added to the mixture. The resulting mixture was coated onto the First polyimide layer using a stainless steel casting rod. The coating was dried on a hot plate at 100° C. until dry by visual inspection. The resulting multilayer film was then placed on a pin frame to hold it flat, and placed in a 120° C. oven. The oven temperature was ramped to 320° C. over a period of 45 to 60 minutes, then transferred to a 400° C. oven and held for 5 minutes, then removed from the oven and allowed to cool.

Comparative Single Layer Film Example C29 was Prepared as Follows

Silica slurry #1 and carbon black slurry #1 were mixed with PMDA/4,4'ODA prepolymer solution (20.6 wt. % polyamic acid solids in DMAC) in amounts to produce the desired composition in the cured film. The mixture was finished by incrementally adding, with mixing, a 6 wt. % solution of PMDA in DMAC, to a final viscosity of 2700 Poise. The finished polymer solution was cooled to approximately 6° C., conversion chemicals acetic anhydride (0.12 cm3/cm3 polymer solution) and 3-picoline (0.12 cm3/cm3 polymer solution) were mixed in, and a film was cast using a slot die, onto a 88° C. hot, rotating drum. The resulting gel film was stripped off the drum and fed into a tenter oven, where it was dried and cured to a solids level greater than 98%, using convective and radiant heating.

Comparative Single Layer Film Examples C26-C28 and C30-C32 were Prepared as Follows A polyamic acid solution, as indicated in Table 1, was finished by incrementally adding, with mixing, a 6 wt. % solution of PMDA in DMAC, to achieve a final viscosity of 2500-3000 Poise. Filler slurries were mixed with the finished polyamic acid solution in appropriate amounts to produce the desired composition after curing. The finished polymer mixture was degassed. Using a stainless steel casting rod, the polymer mixture was manually cast onto a Mylar® polyethylene terephthalate sheet attached to a glass plate. The Mylar® polyethylene terephthalate sheet containing the wet cast film was immersed in a bath consisting of a 50/50 mixture of 3-picoline and acetic anhydride. The bath was gently agitated for a period of 3 to 4 minutes in order to effect imidization and gellation of the film. The gel film was peeled from the Mylar® polyethylene terephthalate sheet and placed on a pin frame to restrain the film and prevent shrinking. After allowing for residual solvent to drain from the film, the pin frame containing the film was placed in a 120° C. oven. The oven temperature was ramped to 320° C. over a period of 45 to 60 minutes, then transferred to a 400° C. oven and held for 5 minutes, then removed from the oven and allowed to cool.

Compositions of the cured films were calculated from the composition of the components in the mixtures, excluding DMAC solvent (which is removed during curing) and accounting for removal of water during conversion of polyamic acid to polyimide.

The 60 degree gloss was measured using a Micro-TRI-gloss glossmeter (from BYK-Gardner).

The L* color was measured using a HunterLab Color-Quest® XE color meter (Hunter Associates Laboratory, Inc.) in the reflectance, specular included mode. The instrument was standardized prior to each use. Color data from the instrument were reported in the CIELAB 10°/D65 system, as L*, a*, b*. A L* value of 0 is pure black, while a L* value of 100 is pure white. Typically, a L* value difference of 1 unit is discernible to the eye.

Particle size of filler slurries was measured by laser diffraction using either a Horiba LA-930 (Horiba, Instruments, Inc., Irvine Calif.) or a Malvern Mastersizer 3000 (Malvern Instruments, Inc., Westborough, Mass.) particle size analyzer. DMAC was used as the carrier fluid.

Alcohol wipe test: The film was wiped 3 times with a towel which was wetted with isopropyl alcohol. A "Fail" grade was given if any colorant was observed to transfer from the film to the towel. This test is a measure of the suitability of the film with respect to durability to processing conditions for electronic circuit manufacture.

Examples 1 thru 18 are illustrative of the invention. The examples illustrate various concentrations of submicron carbon black, silica matting agent, and polyimide within the inventive ranges for the second polyimide layer. The examples also illustrate various thicknesses of the first and second polyimide layers.

Examples 1 through 18 illustrate various types of silica matting agents in the second polyimide layer.

Examples 5, 6, 12, and 13 illustrate different types of sub-micron carbon black in the second polyimide layer.

Examples 5 through 15 and Example 17 illustrate a different aromatic polyimide in the second polyimide layer Examples 3, 16, and 18 illustrate a different aromatic polyimide in the first polyimide layer.

Examples 1 and 2 illustrate different thicknesses in the first polyimide layer.

Comparative examples C1 through C18 and C33 through C36 illustrate various concentrations of submicron carbon black, matting agent, and polyimide outside the inventive ranges for the second polyimide layer. The comparative examples show that there is no composition outside the inventive ranges that gives L* color less than 30 and 60° gloss less than 10.

Comparative examples C1 through C13 illustrate compositions of the second polyimide layer with 85% wt. or greater polyimide, which exhibit L* color greater than 30.

Comparative examples C19 through C23 illustrate that as the percentage of polyimide in the second polyimide layer decreases below 45 wt. %, the durability decreases and the compositions fail the alcohol wipe test. For Comparative examples C22 and C23, the second polyimide layer flakes off or is easily rubbed off, due to the low polyimide content.

Comparative examples C1 through C4, C9 through C11, and C14 through C18 illustrate compositions with percentage polyimide+percentage carbon black greater than 85 wt. % in the second polyimide layer. These compositions all exhibit L* color greater than 30.

Comparative Examples C24 and C25 illustrate that matting agents other than silica in the second polyimide layer do not result in L* color less than 30.

Comparative examples C26 through C32 are single layer films with a variety of compositions that encompass the range of compositions of the second polyimide layer in the multilayer film examples. Examples C26 through C31 exhibit L* color greater than 30. Examples C30 and C32 fail the alcohol wipe test, and Example 32 additionally is too brittle to be manufacturable or of practical use, due to its low polymer content.

Results are shown in Table 1.

TABLE 1

| | | | | | 2nd PI layer | | | | | | | |
|---|---|---|---|---|---|---|---|---|---|---|---|---|
| | First PI Layer | carbon black | matting agent | PI | First PI layer Thickness (microns) | Second PI layer thickness (microns) | wt % carbon black | wt % matting agent | wt % PI | % carbon black + % PI | alcohol wipe test | L* | 60° gloss |
| 1 | MBC | SB4 | Syloid C807 | PMDA/ODA | 12.5 | 3 | 20 | 20 | 60 | 80.0 | Pass | 29.3 | 1.5 |
| 2 | MBC | SB4 | Syloid C803 | PMDA/ODA | 25 | 4 | 20 | 20 | 60 | 80.0 | Pass | 29.8 | 1.5 |
| 3 | HN | SB4 | Syloid C807 | PMDA/ODA | 25 | 3 | 15 | 25 | 60 | 75.1 | Pass | 28.3 | 1.1 |
| 4 | MBC | SB4 | Syloid C807 | PMDA/ODA | 25 | 5 | 10 | 30 | 60 | 70.1 | Pass | 26.7 | 0.4 |
| 5 | MBC | SB6 | Syloid C807 | PMDA/ODA/PPD | 25 | 4 | 10 | 30 | 60 | 70.0 | Pass | 26.8 | 0.4 |
| 6 | MBC | FW200 | Syloid C807 | PMDA/ODA/PPD | 25 | 5 | 10 | 30 | 60 | 70.0 | Pass | 26.8 | 0.4 |
| 7 | MBC | SB4 | Syloid C807 | PMDA/ODA/PPD | 25 | 1 | 5 | 36 | 59 | 63.9 | Pass | 28.1 | 0.6 |
| 8 | MBC | SB4 | Syloid C807 | PMDA/ODA/PPD | 25 | 3 | 3 | 32 | 60 | 63.0 | Pass | 27.9 | 0.4 |
| 9 | MBC | SB4 | Syloid C803 | PMDA/ODA/PPD | 25 | 5 | 3 | 32 | 60 | 63.0 | Pass | 27.9 | 0.6 |
| 10 | MBC | SB4 | HK400 | PMDA/ODA/PPD | 25 | 5 | 3 | 32 | 60 | 63.0 | Pass | 25.4 | 0.3 |
| 11 | MBC | SB4 | Sipernat 500LS | PMDA/ODA/PPD | 25 | 5 | 3 | 32 | 60 | 63.0 | Pass | 26.8 | 0.4 |
| 12 | MBC | SB6 | Syloid C807 | PMDA/ODA/PPD | 25 | 4 | 3 | 32 | 60 | 63.0 | Pass | 26.8 | 0.4 |
| 13 | MBC | FW200 | Syloid C807 | PMDA/ODA/PPD | 25 | 6 | 3 | 32 | 60 | 63.0 | Pass | 26.8 | 0.4 |
| 14 | MBC | SB4 | Syloid C807 | PMDA/ODA/PPD | 25 | 5 | 1 | 39 | 60 | 61.0 | Pass | 28.3 | 0.4 |
| 15 | MBC | SB4 | Syloid C807 | PMDA/ODA/PPD | 25 | 3 | 36 | 15 | 49 | 84.7 | Pass | 29.9 | 4.2 |
| 16 | HN | SB4 | Syloid C807 | PMDA/ODA | 25 | 6 | 25 | 25 | 50 | 75.1 | Pass | 24.0 | 0.2 |
| 17 | MBC | SB4 | Syloid C807 | PMDA/ODA/PPD | 25 | 11 | 15 | 36 | 49 | 64.2 | Pass | 21.4 | 0.3 |
| 18 | HN | SB4 | Syloid C807 | PMDA/ODA | 25 | 4 | 25 | 30 | 45 | 70.0 | Pass | 17.4 | 0.2 |
| C1 | MBC | SB4 | Syloid C807 | PMDA/ODA | 25 | 8 | 5 | 8 | 87 | 92.0 | Pass | 34.4 | 11.9 |
| C2 | MBC | SB4 | Syloid C807 | PMDA/ODA | 25 | 8 | 1 | 9 | 90 | 91.0 | Pass | 33.7 | 10.9 |
| C3 | MBC | — | Syloid C807 | PMDA/ODA | 12.5 | 6 | 0 | 10 | 90 | 90.0 | Pass | 32.8 | 14.4 |
| C4 | MBC | SB4 | Syloid C807 | PMDA/ODA/PPD | 25 | 9 | 16 | 5 | 79 | 94.8 | Pass | 32.0 | 21.5 |
| C5 | MBC | SB6 | Syloid C807 | PMDA/ODA | 25 | 15 | 11 | 10 | 73 | 84.4 | Pass | 32.9 | 7.0 |
| C6 | MBC | SB4 | Syloid C807 | PMDA/ODA | 25 | 5 | 5 | 16 | 79 | 84.4 | Pass | 33.1 | 4.7 |
| C7 | MBC | SB4 | Syloid C807 | PMDA/ODA | 25 | 19 | 1 | 20 | 79 | 80.1 | Pass | 33.6 | 3.7 |
| C8 | MBC | SB4 | Syloid C807 | PMDA/ODA | 25 | 7 | 15 | 10 | 75 | 90.0 | Pass | 31.5 | 7.0 |
| C9 | MBC | SB4 | Syloid C807 | PMDA/ODA/PPD | 25 | 5 | 26 | 5 | 69 | 94.8 | Pass | 31.6 | 18.4 |
| C10 | MBC | SB4 | Syloid C807 | PMDA/ODA/PPD | 25 | 18 | 21 | 10 | 69 | 89.6 | Pass | 31.8 | 11.1 |
| C11 | MBC | SB4 | Syloid C807 | PMDA/ODA | 25 | 17 | 15 | 15 | 70 | 85.0 | Pass | 30.8 | 4.4 |
| C12 | MBC | SB4 | Syloid C807 | PMDA/ODA/PPD | 25 | 13 | 5 | 26 | 69 | 74.1 | Pass | 32.8 | 2.6 |
| C13 | MBC | SB4 | Syloid C807 | PMDA/ODA/PPD | 25 | 5 | 1 | 31 | 68 | 69.0 | Pass | 32.6 | 1.1 |
| C14 | HN | SB4 | Syloid C807 | PMDA/ODA | 25 | 3 | 30 | 10 | 60 | 90.0 | Pass | 30.5 | 4.4 |
| C15 | MBC | SB4 | Syloid C807 | PMDA/ODA | 25 | 3 | 30 | 10 | 60 | 90.0 | Pass | 30.2 | 5.5 |
| C16 | HN | SB4 | Syloid C807 | PMDA/ODA | 25 | 3 | 25 | 15 | 60 | 85.0 | Pass | 30.1 | 2.2 |
| C17 | MBC | SB4 | Syloid C807 | PMDA/ODA/PPD | 25 | 15 | 46 | 5 | 49 | 94.9 | Pass | 31.6 | 13.8 |
| C18 | MBC | SB4 | Syloid C807 | PMDA/ODA/PPD | 25 | 1 | 41 | 10 | 49 | 89.8 | Pass | 30.3 | 7.1 |
| C19 | MBC | SB4 | Syloid C807 | PMDA/ODA/PPD | 25 | 3 | 46 | 10 | 44 | 89.8 | Fail | 29.7 | 5 |
| C20 | HN | SB4 | Syloid C807 | PMDA/ODA | 25 | 1 | 30 | 30 | 40 | 70.0 | Fail | 25.7 | 7.7 |
| C21 | HN | SB4 | Syloid C807 | PMDA/ODA | 25 | 1 | 50 | 10 | 40 | 90.0 | Fail | 24.4 | 33.7 |
| C22 | HN | SB4 | Syloid C807 | PMDA/ODA | 25 | 2 | 15 | 55 | 30 | 45.0 | Fail | 20.4 | 0.2 |
| C23 | MBC | SB4 | Syloid C807 | PMDA/ODA/PPD | 25 | 2 | 40 | 20 | 20 | 59.9 | Fail | 18.3 | 0.8 |
| C24 | MBC | SB4 | alumina | PMDA/ODA/PPD | 25 | 3 | 10 | 31 | 59 | 69.1 | Pass | 32.3 | 6.2 |
| C25 | MBC | SB4 | PI particles | PMDA/ODA/PPD | 25 | 3 | 10 | 31 | 59 | 69.0 | Pass | 30.8 | 9.3 |
| C26 | single layer | SB4 | Syloid C807 | PMDA/ODA | 40 | | 5 | 8 | 87 | 92.0 | Pass | 32.9 | 4.2 |
| C27 | single layer | SB6 | Syloid C807 | PMDA/ODA | 38 | | 11 | 10 | 73 | 84.4 | Pass | 30.8 | 2.3 |
| C28 | single layer | SB4 | Syloid C807 | PMDA/ODA/PPD | 58 | | 5 | 16 | 79 | 84.4 | Pass | 32.3 | 1.4 |
| C29 | single layer | SB4 | Syloid C807 | PMDA/ODA | 40 | | 15 | 10 | 75 | 90.0 | Fail | 32.3 | 2.5 |
| C30 | single layer | SB4 | Syloid C807 | PMDA/ODA/PPD | 74 | | 5 | 26 | 69 | 74.1 | Pass | 31.3 | 0.5 |
| C31 | single layer | SB4 | Syloid C807 | PMDA/ODA/PPD | 56 | | 5 | 36 | 59 | 63.9 | Pass | 32.3 | 0.4 |
| C32 | single layer | SB4 | Syloid C807 | PMDA/ODA/PPD | 74 | | 15 | 36 | 49 | 64.2 | Fail | 27.0 | 0.4 |
| C33 | MBC | SB6 | Syloid C807 | PMDA/ODA/PPD | 25 | 1 | 20 | 12 | 60 | 72 | Pass | 30.93 | 4.1 |
| C34 | MBC | SB6 | Syloid C807 | PMDA/ODA/PPD | 25 | 2 | 20 | 14 | 58 | 72 | Pass | 30.74 | 2.5 |
| C35 | MBC | SB6 | Syloid C807 | PMDA/ODA/PPD | 25 | 1 | 14 | 12 | 67 | 79 | Pass | 32.35 | 7.8 |
| C36 | MBC | SB6 | Syloid C807 | PMDA/ODA/PPD | 25 | 4 | 13 | 14 | 67 | 81 | Pass | 32.35 | 2.9 |

The materials, methods, and examples herein are illustrative only and, except as specifically stated, are not intended to be limiting. Although methods and materials similar or equivalent to those described herein can be used in the practice or testing of the present invention, suitable methods and materials are described herein.

Note that not all of the activities described above in the general description or the examples are required, that a portion of a specific activity may not be required, and that further activities may be performed in addition to those described. Still further, the order in which each of the activities are listed are not necessarily the order in which they are performed. After reading this specification, skilled artisans will be capable of determining what activities can be used for their specific needs or desires.

In the foregoing specification, the invention has been described with reference to specific embodiments. However, one of ordinary skill in the art appreciates that various modifications and changes can be made without departing from the scope of the invention as set forth in the claims below. All features disclosed in this specification may be replaced by alternative features serving the same, equivalent or similar purpose.

Accordingly, the specification is to be regarded in an illustrative rather than a restrictive sense and all such modifications are intended to be included within the scope of the invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A multilayer film comprising:
   a. a first polyimide layer from 8 to 130 microns thick comprising: a polyimide derived from at least 50 mole percent of an aromatic dianhydride, based upon a total dianhydride content of the polyimide, and at least 50 mole percent of an aromatic diamine based upon a total diamine content of the polyimide;
   b. a second polyimide layer from 0.5 to 25 microns thick in direct contact with the first polyimide layer, the second polyimide layer comprising:
      i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
      ii) greater than 14 wt % of a silica matting agent or a mixture of silica matting agent and at least one additional matting agent; and
      iii) at least one submicron carbon black, wherein the total amount of the submicron carbon black and the polyimide is less than 85 wt % and greater than 45 wt %; and
   wherein the multilayer film has an L* color less than 30 and a 60 degree gloss value less than 10.

2. The multilayer film in accordance with claim 1, wherein the polyimide of the second polyimide layer is derived from pyromellitic dianhydride and 4,4'-oxydianiline or derived from pyromellitic dianhydride, 4,4'-oxydianiline and paraphenylenediamine.

3. The multilayer film in accordance with claim 1, wherein the polyimide of the second polyimide layer is derived from i) blocks of pyromellitic dianhydride and 4,4'-oxydianiline and ii) blocks of pyromellitic dianhydride and paraphenylenediamine.

4. The multilayer film in accordance with claim 1, wherein the polyimide of the first polyimide layer is derived from pyromellitic dianhydride and 4,4'-oxydianiline.

5. The multilayer film in accordance with claim 1, wherein the polyimide of the first polyimide layer is derived from pyromellitic dianhydride and 4,4'-oxydianiline, and wherein the polyimide of the second polyimide layer is derived from
   i) pyromellitic dianhydride and 4,4'-oxydianiline, or derived from
   ii) pyromellitic dianhydride, 4,4'-oxydianiline and paraphenylenediamine, or derived from
   iii) blocks of pyromellitic dianhydride and 4,4'-oxydianiline and blocks of pyromellitic dianhydride and paraphenylenediamine.

6. The multilayer film in accordance with claim 1, the first polyimide layer further comprising:
   i.) 1 to 15 wt % low conductivity carbon black, or
   ii.) 1 to 40 wt % pigment or dye.

7. The multilayer film in accordance with claim 6, the first polyimide layer further comprising 1 to 20 wt % of a matting agent selected from silica, alumina, zirconia, boron nitride, barium sulfate, polyimide particles, calcium phosphate, talc or mixtures thereof.

8. The multilayer film in accordance with claim 6, the first polyimide layer further comprising 1 to 20 wt % of a matting agent that is a carbon black having a mean particle size from 2 to 9 micrometers.

9. The multilayer film in accordance with claim 6, the first polyimide layer further comprising 1 to 20 wt % of a matting agent, the matting agent being a mixture of
   i) carbon black having a mean particle size from 2 to 9 microns; and
   ii) silica, alumina, zirconia, boron nitride, barium sulfate, polyimide particles, calcium phosphate, talc or mixtures thereof.

10. The multilayer film in accordance with claim 1, further comprising an adhesive layer in direct contact with the first polyimide layer opposite the second polyimide layer.

11. The multilayer film in accordance with claim 10, wherein the adhesive layer is an epoxy resin selected from the group consisting of: Bisphenol A type epoxy resin, cresol novolac type epoxy resin, phosphorus containing epoxy resin, and mixtures thereof.

12. The multilayer film in accordance with claim 1, further comprising a third polyimide layer from 0.5 to 25 microns thick in direct contact with the first polyimide layer opposite the second polyimide layer, the third polyimide layer comprising:
   i) 45 to 67 wt % of a polyimide derived from at least 50 mole percent of an aromatic dianhydride, based upon a total dianhydride content of the polyimide, and at least 50 mole percent of an aromatic diamine based upon a total diamine content of the polyimide
   ii) greater than 14 wt % of a matting agent or mixture of matting agents; and
   iii) at least one submicron carbon black, wherein the total amount of the submicron carbon black and the polyimide is less than 85 wt % and greater than 45 wt %.

13. The multilayer film in accordance with claim 12, wherein the matting agent in the third polyimide layer is selected from silica, alumina, zirconia, boron nitride, barium sulfate, polyimide particles, calcium phosphate, talc or mixtures thereof.

14. The multilayer film in accordance with claim 12, wherein the matting agent in the third polyimide layer is a carbon black having a mean particle size from 2 to 9 microns.

15. The multilayer film in accordance with claim 12, wherein the matting agent in the third polyimide layer is a mixture of
   i) carbon black having a mean particle size from 2 to 9 microns; and
   ii) silica, alumina, zirconia, boron nitride, barium sulfate, polyimide particles, calcium phosphate, talc or mixtures thereof.

16. The multilayer film in accordance with claim 12, further comprising an adhesive layer in direct contact with the second polyimide layer or the third polyimide layer on a surface of the second polyimide layer or the third polyimide layer opposite from the first polyimide layer.

17. The multilayer film in accordance with claim 12, the first polyimide layer further comprising:
   i) 1 to 15 wt % low conductivity carbon black, or
   ii) 1 to 40 wt % pigment or dye.

18. The multilayer film in accordance with claim 17, the first polyimide layer further comprising 1 to 20 wt % of a matting agent selected from silica, alumina, zirconia, boron nitride, barium sulfate, polyimide particles, calcium phosphate, talc or mixtures thereof.

19. The multilayer film in accordance with claim 17, the first polyimide layer further comprising 1 to 20 wt % of a matting agent that is a carbon black having a mean particle size from 3 to 9 micrometers.

20. The multilayer film in accordance with claim 17, the first polyimide layer further comprising matting agent mixture of
   i) carbon black having a mean particle size from 2 to 9 microns; and
   ii) silica, alumina, zirconia, boron nitride, barium sulfate, polyimide particles, calcium phosphate, talc or mixtures thereof.

* * * * *